United States Patent
Yamazaki et al.

(10) Patent No.: US 6,819,104 B2
(45) Date of Patent: Nov. 16, 2004

(54) SYSTEMS AND METHODS FOR IMPROVING QUALITY OF IMAGES GENERATED BY A MEDICAL IMAGING DEVICE

(75) Inventors: Aki Yamazaki, Tokyo (JP); Yoshihiro Oda, Tokyo (JP); Naotaka Adachi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 113 days.

(21) Appl. No.: 10/176,225

(22) Filed: Jun. 20, 2002

(65) Prior Publication Data

US 2002/0196019 A1 Dec. 26, 2002

(30) Foreign Application Priority Data

Jun. 21, 2001 (JP) ........................................ 2001-187956

(51) Int. Cl.[7] ................................................. G01V 3/00
(52) U.S. Cl. ........................................................ 324/307
(58) Field of Search ................................. 324/307, 309, 324/318

(56) References Cited

U.S. PATENT DOCUMENTS

| | | | |
|---|---|---|---|
| 4,639,671 A | * | 1/1987 | Macovski .................... 324/309 |
| 4,706,024 A | | 11/1987 | Dumoulin |
| 4,728,933 A | | 3/1988 | Mazza |
| 4,752,734 A | | 6/1988 | Wedeen |
| 4,766,382 A | | 8/1988 | Ohuchi |
| 4,780,675 A | | 10/1988 | DeMeester et al. |
| 4,800,889 A | | 1/1989 | Dumoulin et al. |
| 4,849,697 A | | 7/1989 | Cline et al. |
| 4,851,779 A | | 7/1989 | DeMeester et al. |
| 4,912,413 A | | 3/1990 | DeMeester et al. |
| 4,918,386 A | | 4/1990 | Dumoulin et al. |
| 5,034,692 A | | 7/1991 | Laub et al. |
| 5,189,369 A | * | 2/1993 | Takane et al. ............... 324/306 |
| 5,256,967 A | * | 10/1993 | Foo et al. .................... 324/311 |
| 5,347,216 A | * | 9/1994 | Foo ............................. 324/309 |
| 5,391,989 A | * | 2/1995 | Takane et al. ............... 324/306 |
| 5,729,140 A | | 3/1998 | Kruger et al. |
| 6,235,264 B1 | | 5/2001 | Uzgiris |
| 6,275,038 B1 | | 8/2001 | Harvey |
| 6,289,233 B1 | | 9/2001 | Dumoulin et al. |
| 6,292,684 B1 | | 9/2001 | Du et al. |
| 6,307,368 B1 | * | 10/2001 | Vasanawala et al. ......... 324/309 |
| 6,310,478 B1 | * | 10/2001 | Heid ........................... 324/309 |
| 6,392,408 B1 | * | 5/2002 | Barrall et al. ............... 324/300 |
| 6,493,569 B2 | * | 12/2002 | Foo et al. .................... 600/410 |
| 6,552,542 B1 | * | 4/2003 | Overall ....................... 324/309 |
| 6,577,128 B1 | * | 6/2003 | Smith et al. ................. 324/309 |
| 2003/0137298 A1 | * | 7/2003 | Yamazaki .................... 324/309 |

FOREIGN PATENT DOCUMENTS

JP 2898329 B 5/1999

* cited by examiner

*Primary Examiner*—Diego Gutierrez
*Assistant Examiner*—Dixomara Vargas
(74) *Attorney, Agent, or Firm*—Carl B. Horton, Esq.; Armstrong Teasdale LLP (57) ABSTRACT

An object of the present invention is to produce images devoid of band artifacts. Data acquisition in SSFP is repeated N times (where N denotes the power of 2) in order to acquire data fv(k), which ranges from data fv(0) to data fv(N−1), from views v constituting a k-space. At this time, the phase of an RF pulse is varied based on an expression of 360°·v·k/N. If an operator designates Fourier transform imaging, a Fourier transform is performed on data fv(k) relative to each of the phases indicated by the RF pulse in order to produce data Fv(n). If the operator does not designate Fourier transform imaging, the data fv(k) is regarded as the data Fv(n) as it is. Any of at least either of weighted addition and MIP processing and root-mean-square conversion selected by the operator is then performed on the data Fv(n) in order to produce data Av. An image is reconstructed based on the data Av.

20 Claims, 4 Drawing Sheets

SYSTEMS AND METHODS FOR IMPROVING QUALITY OF IMAGES GENERATED BY A MEDICAL IMAGING DEVICE

CROSS REFERENCE TO RELATED APPLICATIONS

This application claims the benefit of Japanese Application No. 2001-187956 filed Jun. 21, 2001.

BACKGROUND OD THE INVENTION

The present invention relates to a magnetic resonance (MR) imaging method and a magnetic resonance imaging (MRI) system. More particularly, the present invention relates to an MR imaging method and an MRI system capable of reconstructing good-quality images.

U.S. Pat. No. 2,898,329 has disclosed an MR imaging method according to which:

(1) data acquisition in steady-state free precession (SSFP) is repeated by sequentially changing a phase for phase encoding until data fv(0) is acquired from views v constituting a k-space;

(2) data acquisition in SSFP is repeated by sequentially changing a phase for phase encoding and alternately shifting the phase of an RF pulse by 180°, whereby data fv(1) is acquired from views v constituting a k-space;

(3) fv(0) and fv(1) are subjected to addition or subtraction in order to produce data Av that is expressed as follows:

$Av=0.5 \times Fv(0)+0.5 \times Fv(1)$ or $Av=0.5 \times Fv(0)-0.5 \times Fv(1)$; and (4) an image is reconstructed based on the produced data Av.

According to the MR imaging method disclosed in U.S. Pat. No. 2,898,329, good-quality images are produced in some cases. However, only poor-quality images (for example, images having band artifacts caused by an inhomogeneous magnetic field) can be produced in other cases.

SUMMARY OF THE INVENTION

Therefore, an object of the present invention is to provide an MR imaging method and an MRI system capable of reconstructing good-quality images in cases where any conventional MR imaging method can provide only poor-quality images.

From the first aspect of the present invention, there is provided an MR imaging method having steps described below. That is to say, at the first step (1), data acquisition in steady-state free precession (SSFP) is repeated N times (where N equals the power of 2) by sequentially changing a phase for phase encoding until data fv(k) ranging from data fv(0) to data fv(N−1) is acquired from views v constituting a k-space. At this time, the phase of a radio-frequency (RF) pulse is varied based on an expression of 360°·v·k/N. At the second step (2), if an operator designates Fourier transform (FT) imaging, the data fv(k) is phase-encoded relative to the phases indicated by the RF pulse and then subjected to a Fourier transform. This results in data Fv(n). In contrast, if the operator does not designate Fourier transform imaging, the data fv(k) is regarded as data Fv(n) as it is. At the third step (3), any of at least either of weighted addition and maximum intensity projection (MIP) processing and root-means-square conversion which is selected by the operator is performed on the data Fv(n) in order to produce data Av. At the fourth step (4), an image is reconstructed based on the produced data Av.

According to the MR imaging method provided from the first aspect of the present invention, an operator can designate whether a Fourier transform (FT) should be performed on the data fv(k) relative to each of the phases indicated by the RF pulse. The Fourier transform makes it possible to designate whichever of the free induction decay (FID) component of data and the spin echo or stimulated echo component thereof should be dominant owing to the principle described below.

For example, when N=4, if $_{k=0}$, the phase of an RF pulse is set to 0 for all times of data acquisition. The polarity of the FID component of data fv(0) agrees with a positive Y direction (the positive direction of a Y axis), while the polarity of the spin echo or stimulated echo component thereof agrees with a negative Y direction (the negative direction of the Y axis). If k=1, the phase of an RF pulse is set sequentially to 0, π/2, π, 3π/2, etc. The polarity of the FID component of data fv(1) agrees with the positive Y direction, while the polarity of the spin echo or stimulated echo component thereof agrees with a positive X direction (the positive direction of the X axis). If k=2, the phase of an RF pulse is set alternately to 0 and π. The polarity of the FID component of data fv(2) agrees with the positive Y direction, and the polarity of the spin echo or stimulated echo component thereof also agrees with the positive Y direction. If k=3, the phase of an RF pulse is set sequentially to 0, 3π/2, π, π/2, etc. The polarity of the FDI component of data fv(3) agrees with the positive Y direction, while the polarity of the spin echo or stimulated echo component thereof agrees with a negative X direction (the negative direction of the X axis).

Since data Fv(0)=fv(0)+fv(1)+fv(2)+fv(3), the FID components are left intact because the spin echo or stimulated echo components are canceled out due to the above polarities. In reality, a situation disagrees with the ideal. Nevertheless, in the resultant data Fv(0), the FID component thereof is dominant. Moreover, since data Fv(1)=fv(0)−j·fv(1)−fv(2)+j·fv(3), the spin echo or stimulated echo components are left intact because the FID components are canceled out due to the above polarities. Consequently, the spin echo or stimulated echo component of the data Fv(1) is dominant. In general, if n in data Fv(n) assumes an odd-numbered value, the FID component is dominant. If n assumes an even-numbered value, the spin echo or stimulated echo component is dominant. Thus, whichever of the FID component and the spin echo or stimulated echo component is dominant can be designated.

Moreover, according to the MR imaging method provided from the first aspect of the present invention, an operator can select processing to be performed on the data Fv(n) from among at least either of weighted addition and MIP and root-mean-square conversion. If weighted addition is performed on the data, whichever of the FID component and the spin echo or stimulated echo component is dominant can be designated. If MIP is performed, a signal-to-noise ratio can be improved. Moreover, If root-mean-square conversion is performed, the signal-to-noise ratio can be improved.

According to the MR imaging method provided from the first aspect of the present invention, processing can be selected from among at least four kinds of processing. In cases where any conventional MR imaging method can produce only poor-quality images, good-quality images may be able to be produced.

Studies made by the present inventor have revealed that: according to the MR imaging method disclosed in the U.S. Pat. No. 2,898,329, if root-mean-square conversion is performed on data fv(0) and fv(1) that represent view images having band artifacts, an image devoid of the band artifacts may be produced. Moreover, if the number of times of repetition N is increased (for example, 8 or more) and a Fourier transform and root-mean-square conversion are selected, a good-quality image is produced in many cases.

From the second aspect of the present invention, there is provided an MR imaging method comprising the steps described below. Namely, at the first step (1), data acquisition in SSFP is repeated N times (where N equals the power of 2) by sequentially changing a phase for phase encoding until data fv(k) ranging from data fv(0) to data fv(N−1) is acquired from views v constituting a k-space. At this time, the phase of an RF pulse is varied based on an expression of 360°·v·k/N. At the second step (2), a Fourier transform is performed on the data fv(k) relative to each of the phases indicated by the RF pulse in order to produce data Fv(n). At the third step (3), any of at least either of weighted addition and MIP processing and root-mean-square conversion selected by an operator is performed on the data Fv(n) in order to produce data Av. At the fourth step (4), an image is reconstructed based on the produced data Av.

According to the MR imaging method provided from the second aspect of the present invention, a Fourier transform is performed on the data fv(k) relative to each of the phases indicated by the RF pulse. The Fourier transform makes it possible to designate whichever of the FID component of the data and the spin echo or stimulated echo component thereof should be dominant. Moreover, an operator can select processing to be performed on the data Fv(n) from among at least either of weighted addition and MIP processing and root-mean-square conversion. If weighted addition is performed, whichever of the FID component of the data and the spin echo or stimulated echo component thereof should be dominant can be designated. If MIP processing is performed, a signal-to-noise ratio can be improved. If root-mean-square conversion is performed, the signal-to-noise ratio can be improved. As mentioned above, either of at least two kinds of processing can be selected. In cases where any conventional MR imaging method can produce only poor-quality images, good-quality images may be able to be produced.

Studies made by the present inventor have revealed that when the number of times of repetition N is increased (for example, 8 or more), if a Fourier transform and root-mean-square conversion are performed, good-quality images are produced in many cases.

From the third aspect of the present invention, there is provided an MR imaging method consisting mainly of the steps described below. Namely, at the first step (1), data acquisition in SSFP is repeated N times (where N equals the power of 2) by sequentially changing a phase for phase encoding until data fv(k) ranging from data fv(0) to data fv(N−1) is acquired from views v constituting a k-space. At this time, the phase of an RF pulse is varied based on an expression of 360°·v·k/N. At the second step (2), the data fv(k) is regarded as data Fv(n) as it is. At the third step (3), any of at least either of weighted addition and MIP processing and root-mean-square conversion selected by an operator is performed on the data Fv(n) in order to produce data Av. At the fourth step (4), an image is reconstructed based on the produced data Av.

According to the MR imaging method provided from the third aspect of the present invention, an operator can select processing to be performed on the data Fv(n) from among at least either of weighted addition and MIP processing and root-mean-square conversion. If weighted addition is performed, whichever of the FID component of the data and the spin echo or stimulated echo component thereof should be dominant can be designated. If MIP processing is performed, a signal-to-noise ratio can be improved. If root-mean-square conversion is performed, the signal-to-noise ratio can be improved. Thus, the operator can select either of at least two kinds of processing. In cases where any conventional MR imaging method can produce only poor-quality images, good-quality images may be able to be produced.

Studies made by the present inventor have revealed that: according to the MR imaging method disclosed in the U.S. Pat. No. 2,898,329, if root-mean-square conversion is performed on data fv(0) and fv(1) that represent view images having band artifacts, an image devoid of the band artifacts may be produced in some cases.

From the fourth aspect of the present invention, there is provided an MR imaging method based on any of the aforesaid MR imaging methods. Specifically, a pulse sequence used to acquire data in SSFT enables concurrent acquisition of an FID signal and an echo. Moreover, each of magnetic field gradients exhibits time-varying strength whose values detected during one repetition time TR is integrated to be 0.

Various pulse sequences be used for data acquisition in SSFT are known. For example, a pulse sequence used for fast imaging employing steady state acquisition (FIESTA) and a pulse sequence used for TrueSSFT are known.

According to the MR imaging method provided from the fourth aspect of the present invention, the pulse sequence used for FIESTA can be adopted.

From the fifth aspect of the present invention, there is provided an MR imaging method based on any of the aforesaid MR imaging methods. Herein, the data Fv(n) resulting from the Fourier transform performed relative to each of the phases indicated by the RF pulse is expressed as follows:

$$Fv(n) = \textstyle\sum_{k=0}^{N-1} fv(k) \cdot \exp\{-j \cdot n2\pi \cdot k/M\}$$

According to the MR imaging method provided from the fifth aspect of the present invention, the Fourier transform can be performed on the data fv(k) relative to each of the phases indicated by the RF pulse.

From the sixth aspect of the present invention, there is provided an MR imaging method based on any of the aforesaid MR imaging methods. Herein, the data Av resulting from weighted addition performed when N=2 is expressed as follows:

$$Av = 0.5 \times Fv(0) + 0.5 \times Fv(1)$$

According to the MR imaging method provided from the sixth aspect of the present invention, the FID component of the data fv(k) can be made dominant.

From the seventh aspect of the present invention, there is provided an MR imaging method based on any of the aforesaid MR imaging methods. Herein, the data Av resulting from weighted addition performed when N=2 is expressed as follows:

$$Av = 0.5 \times Fv(0) - 0.5 \times Fv(1)$$

According to the MR imaging method provided from the seventh aspect, the spin echo or stimulated echo component of the data fv(k) can be made dominant.

From the eighth aspect of the present invention, there is provided an MR imaging method based on any of the aforesaid MR imaging methods. Herein, the data Av resulting from MIP processing of solving a function max{ } for providing a maximum value is expressed as follows:

$$Av=\max\{Fv(0), \text{etc.}, Fv(N-1)\}$$

According to the MR imaging method provided from the eighth aspect, a signal of the largest magnitude among all N signals is adopted. Therefore, a signal-to-noise ratio is improved in many cases.

From the ninth aspect of the present invention, there is provided an MR imaging method based on any of the aforesaid MR imaging methods. Herein, the data Av resulting from root-mean-square conversion is expressed as follows:

$$Av=\sqrt{\{(Fv(0)^2 + \ldots + Fv(N-1)^2)/N\}}$$

According to the MR imaging method provided from the ninth aspect, N data items are all employed and will not be canceled out. Consequently, a signal-to-noise ratio is improved in many cases.

From the tenth aspect of the present invention, there is provided an MRI system consisting mainly of a transmitter coil, a gradient coil unit, a receiver coil, a scanning means, and a data processing means. The transmitter coils transmits a radio-frequency (RF) pulse. The gradient coil unit applies magnetic field gradients. The receiver coil receives an NMR signal. The scanning means drives the transmitter coil, gradient coil unit, and receiver coil so as to acquire data. The data processing means performs arithmetic operations on acquired data so as to produce an image. Herein, the scanning means repeats data acquisition in steady-state free precession (SSFP) N times (where N denotes the power of 2) by sequentially changing a phase for phase encoding until data fv(k) ranging from data fv(0) to data fv(N−1) is acquired from views v constituting a k-space. At this time, the phase of the RF pulse is varied based on an expression of 360°·v·k/N. If an operator designates Fourier transform imaging, the data processing means performs a Fourier transform on the data fv(k) relative to each of the phases indicated by the RF pulse, and thus produces data Fv(n). If the operator does not designate Fourier transform imaging, the data fv(k) is regarded as the data Fv(n) as it is. Thereafter, any of at least either of weighted addition and maximum intensity projection (MIP) processing and root-mean-square conversion selected by the operator is performed on the data Fv(n) in order to produce data Av. Consequently, an image is reconstructed based on the produced data Av.

In the MRI system provided from the tenth aspect of the present invention, the MR imaging method provided from the first aspect thereof can be implemented preferably.

From the eleventh aspect of the present invention, there is provided an MRI system consisting mainly of a transmitter coil, a gradient coil unit, a receiver coil, a scanning means, and a data processing means. The transmitter coil transmits an RF pulse. The gradient coil unit applies magnetic field gradients. The receiver coil receives an NMR signal. Herein, the scanning means repeats data acquisition in SSFP N times (where N denotes the power of 2) by sequentially changing a phase for phase encoding until data fv(k) ranging from data fv(0) to data fv(N−1) is acquired from views v constituting a k-space. At this time, the phase of the RF pulse is varied based on an expression of 360°·v·k/N. The data processing means performs a Fourier transform on the data fv(k) relative to each of the phases indicated by the RF pulse so as to produce data Fv(n). Thereafter, any of at least either of weighted addition and MIP processing and root-mean-square conversion selected by an operator is performed on the data Fv(n) in order to produce data Av. Consequently, an image is reconstructed based on the produced data Av.

In the MRI system provided from the eleventh aspect of the present invention, the MR imaging method provided from the second aspect thereof can be implemented preferably.

From the twelfth aspect of the present invention, there is provided an MRI system consisting mainly of a transmitter coil, a gradient coil unit, a receiver coil, a scanning means, and a data processing means. The transmitter coil transmits an RF pulse. The gradient coil unit applies magnetic field gradients. The receiver coil receives an NMR signal. Herein, the scanning means repeats data acquisition in SSFP N times (where N denotes the power of 2) by sequentially changing a phase for phase encoding until data fv(k) ranging from data fv(0) to data fv(N−1) is acquired from views v constituting a k-space. At this time, the phase of the RF pulse is varied based on an expression of 360°·v·k/N. The data processing means regards the data fv(k) as data Fv(n) as it is. Thereafter, any of at least either of weighted addition and MIP processing and root-mean-square conversion selected by an operator is performed on the data Fv(n) in order to produce data Av. Consequently, an image is reconstructed based on the data Av.

In the MRI system provided from the twelfth aspect of the present invention, the MR imaging method provided from the third aspect thereof can be implemented preferably.

From the thirteenth aspect of the present invention, there is provided an MRI system based on any of the aforesaid MRI systems. Herein, a pulse sequence used to acquire data in SSFP enables concurrent acquisition of an FID signal and an echo. Moreover, each of magnetic field gradients exhibits time-varying strength whose values detected during one repetition time TR is integrated to be 0.

In the MRI system provided from the thirteenth aspect of the present invention, the MR imaging method provided from the fourth aspect thereof can be implemented preferably.

From the fourteenth aspect of the present invention, there is provided an MRI system based on any of the aforesaid MRI system. Herein, the data Fv(n) resulting from the Fourier transform performed relative to each of the phases indicated by the RF pulse is expressed as follows:

$$Fv(n) = \sum_{k=0}^{N-1} fv(k) \cdot \exp\{-j \cdot n \cdot 2\pi \cdot k/N\}$$

In the MRI system provided from the fourteenth aspect of the present invention, the MR imaging method provided from the fifth aspect thereof can be implemented preferably.

From the fifteenth aspect of the present invention, there is provided an MRI system based on any of the aforesaid embodiments. Herein, the data Av resulting from weighted addition performed when N=2 is expressed as follows:

$$Av = 0.5 \times Fv(0) + 0.5 \times Fv(1)$$

In the MRI system provided from the fifteenth aspect of the present invention, the MR imaging method provided from the sixth aspect thereof can be implemented preferably.

From the sixteenth aspect of the present invention, there is provided an MRI system based on any of the aforesaid MRI systems. Herein, the data Av resulting from weighted addition performed when N=2 is expressed as follows:

$$Av = 0.5 \times Fv(0) - 0.5 \times Fv(1)$$

In the MRI system provided from the sixteenth aspect of the present invention, the MR imaging method provided from the seventh aspect thereof can be implemented preferably.

From the seventeenth aspect of the present invention, there is provided an MRI system based on any of the aforesaid MRI systems. Herein, the data Av resulting from MIP processing of solving a function max{ } for obtaining a maximum value is expressed as follows:

$$Av = \max\{Fv(0), \ldots, Fv(N-1)\}$$

In the MRI system provided from the seventeenth aspect of the present invention, the MR imaging method provided from the eighth aspect thereof can be implemented preferably.

From the eighteenth aspect of the present invention, there is provided an MRI system based on any of the aforesaid MRI systems. Herein, the data Av resulting from root-mean-square conversion is expressed as follows:

$$Av = \sqrt{\{(Fv(0)^2 + \ldots + Fv(N-1)^2)/N\}}$$

In the MRI system provide from the eighteenth aspect of the present invention, the MR imaging method provided from the ninth aspect thereof can be implemented preferably.

Therefore, an MR imaging method and an MRI system in which the present invention is implemented may be able to produce good-quality images devoid of band artifacts.

Further objects and advantages of the present invention will be apparent from the following description of the preferred embodiments of the invention as illustrated in the accompanying drawings.

DETAILED DESCRIPTION OF THE INVENTION

The present invention will be further described in relation to an embodiment shown in drawings below.

Figure 1:
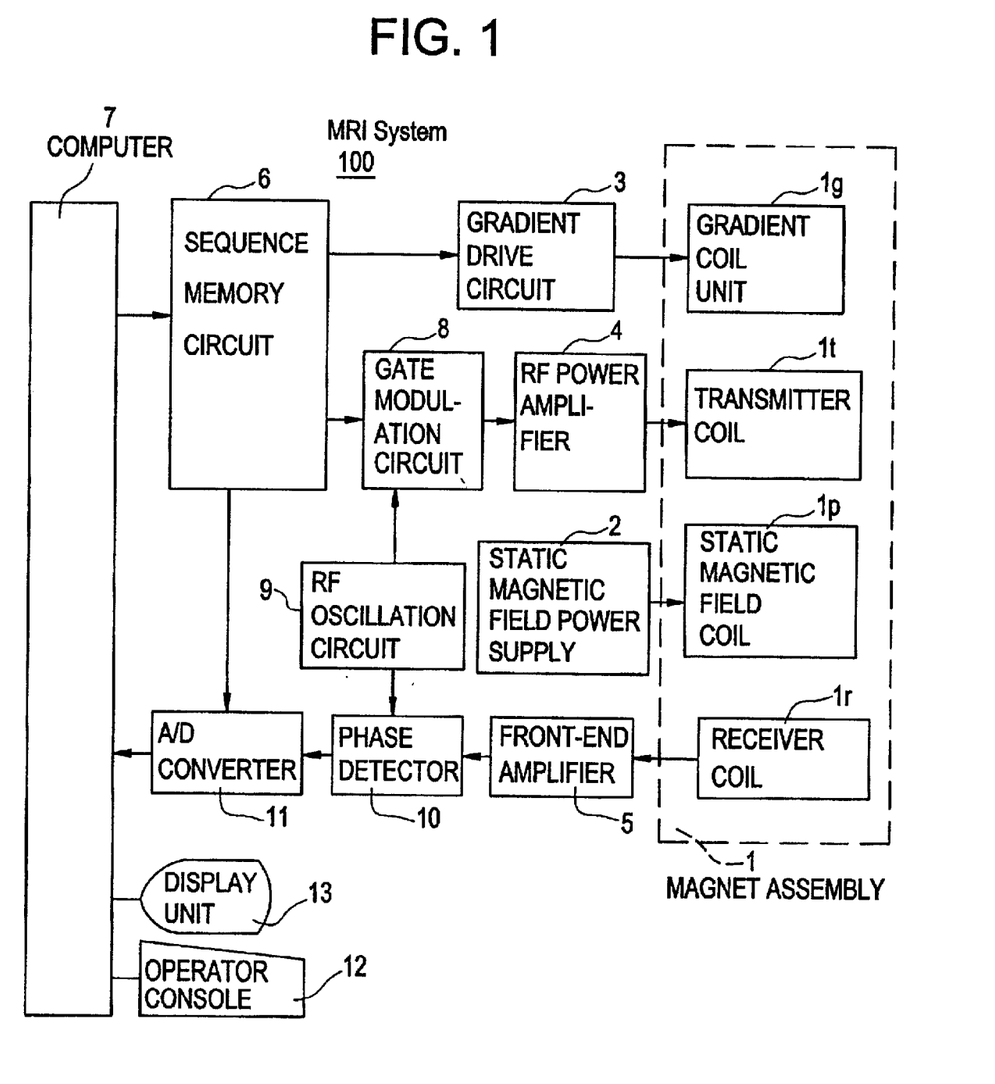
FIG. 1 is a block diagram of an MRI system in accordance with an embodiment of the present invention.

FIG. 1 is a block diagram showing an MRI system in accordance with an embodiment of the present invention.

In the MRI system 100, a magnet assembly 1 has a bore in which a subject is inserted. A static magnetic field coil 1$p$, a gradient coil unit 1$g$, a transmitter coil 1$t$, and a receiver coil 1$r$ are arranged as if to surround the bore. The static magnetic field coil 1$p$ applies a static magnetic field of certain strength to a subject. The gradient coil unit 1$g$ generates magnetic field gradients oriented in the X, Y, and Z axes in a space (defining the directions of slice selection, readout, and phase encoding). The transmitter coil 1$t$ applies a radio-frequency (RF) pulse for exciting the spins of nuclei of a subject. The receiver coil 1$r$ detects an NMR signal induced by the subject. The static magnetic field coil 1$p$, gradient coil unit 1$g$, transmitter coil 1$t$, and receiver coil 1$r$ are connected to a static magnetic field power supply 2, a gradient drive circuit 3, an RF power amplifier 4, and a front-end amplifier 5 respectively.

Incidentally, a permanent magnet may be substituted for the static magnetic field coil 1$p$.

The gradient drive circuit 3 is acted according to a pulse sequence, which is stored in a sequence memory circuit 6, in response to a command issued from a computer 7. This causes the gradient coil unit 1$g$ included in the magnet assembly 1 to generate magnetic field gradients. Concurrently, a gate modulation circuit 8 modulates an output signal of a carrier provided from an RF oscillation circuit 9 into a pulsating signal that exhibits predetermined timing and is detected with a predetermined envelope. The resultant signal is transferred as an RF pulse to the RF power amplifier 4. The RF power amplifier 4 amplifies in power the RF pulse. The resultant pulse is then applied to the transmitter coil 1$t$ included in the magnet assembly 1. Consequently, a desired slice to be imaged is selected and excited.

The front-end amplifier 5 amplifies an NMR signal induced by the subject and detected by the receiver coil 1$r$ included in the magnet assembly 1, and transmits the resultant signal to a phase detector 10. The phase detector 10 uses the carrier output signal of the RF oscillation circuit 9 as a reference signal to detect the phase of the NMR signal sent from the front-end amplifier 5, and then transfers the signal to an A/D converter 11. The A/D converter 11 converts the analog signal, of which phase has been detected, into digital data, and transmits the digital data to the computer 7.

The computer 7 receives information entered at an operator console 12, and is responsible for control of the entire system. Moreover, the computer 7 reads digital data from the A/D converter 11, performs arithmetic operations on the data, and thus produces an image.

Consequently, the image is displayed on a display device 13 or a message is presented thereon.

Figure 2:
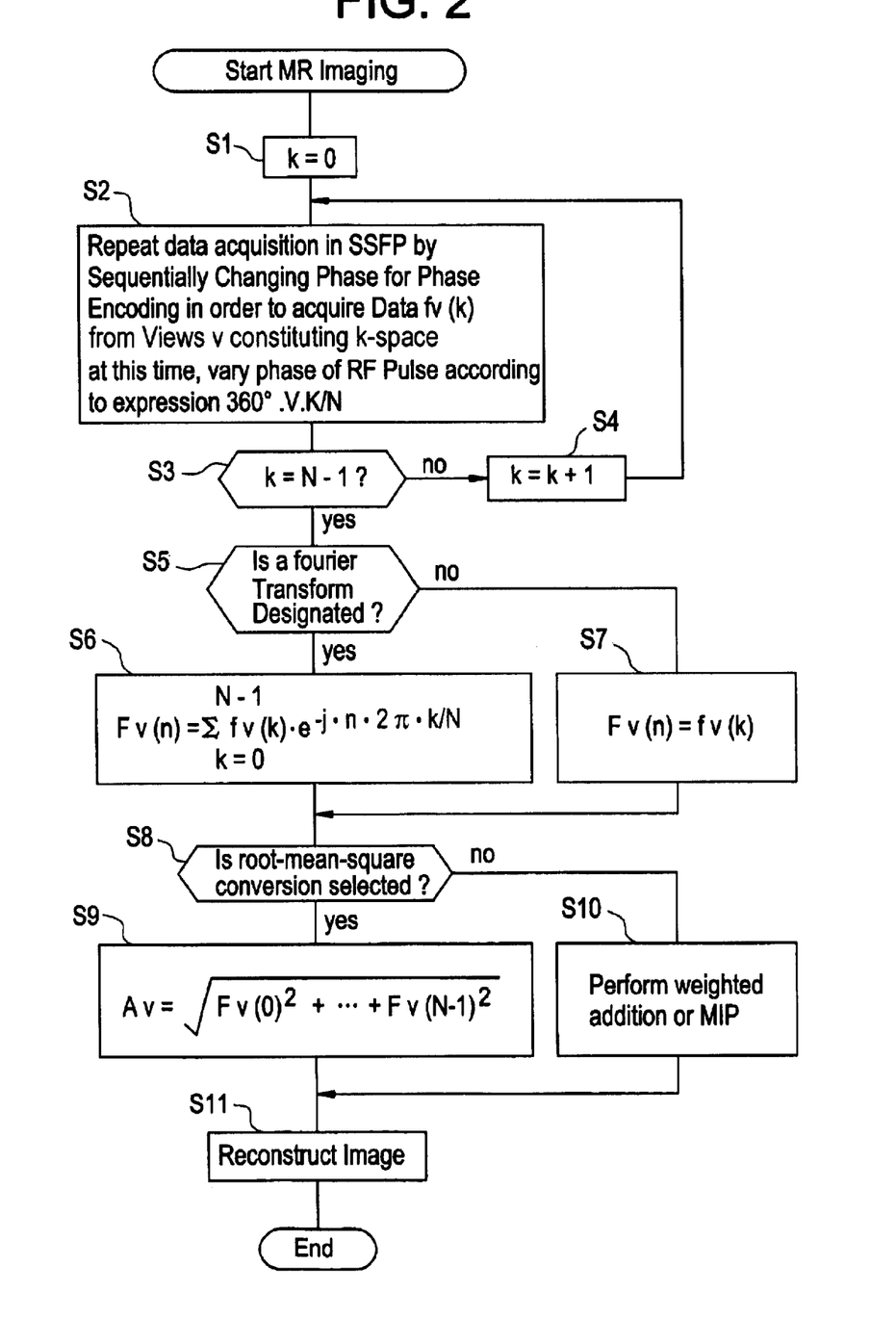
FIG. 2 is a flowchart describing MR imaging performed in the embodiment of the present invention.

FIG. 2 is a flowchart describing MR imaging to be performed by the MRI system 100.

At step S1, a repetition counter k is initialized to 0.

At step S2, data acquisition in steady-state free precession (SSFP) is repeated by sequentially changing a phase for phase encoding until data fv(k) is acquired from views v constituting a k-space. At this time, the phase of an RF pulse is varied based on an expression of 360°·v·k/N.

At step S3 and step S4, the processing of step S2 is repeated N−1 times from the instant the counter k indicates 1 to the instant it indicates N−1.

For brevity's sake, the number of times of repetition N shall be 8. At this time, the phase of an RF pulse is varied based on an expression of v·k·π/4.

Figure 3:
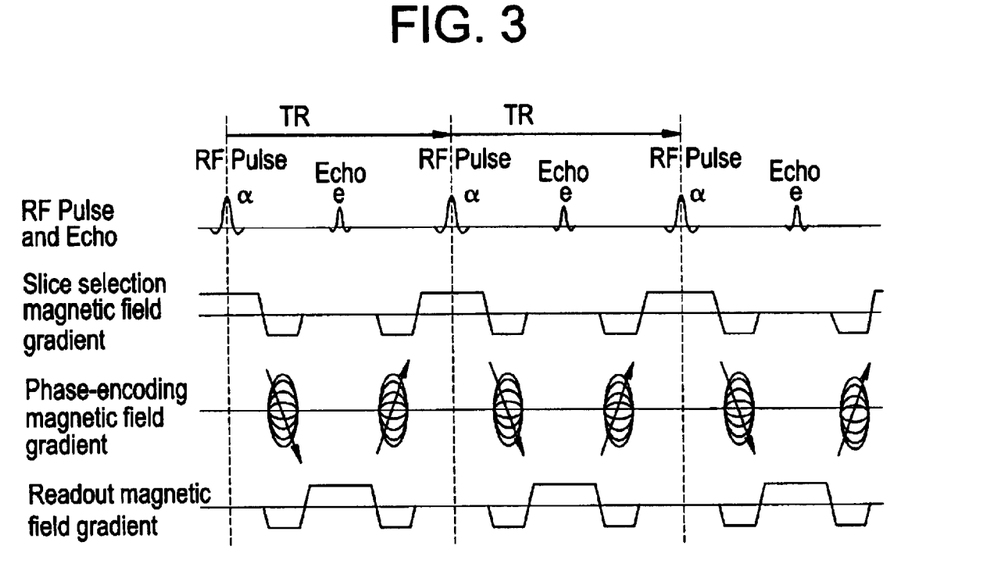
FIG. 3 shows an example of a pulse sequence used for FIESTA.

FIG. 3 shows an example of one of pulse sequences used for data acquisition in SSFP, that is, a pulse sequence used for fast imaging employing steady state acquisition (FIESTA).

According to the FIESTA pulse sequence, an RF pulse is applied repeatedly at intervals of a repetition time TR that is shorter than a transverse relaxation time T2 exhibited by a subject to be measured. A free induction decay (FID) signal and an echo (a spin echo or a stimulated echo) produced in SSFP are detected in order to acquire data fv(k). Magnetic field gradients to be adopted are such that each of the magnetic field gradients exhibit time-varying strength whose values detected during one repetition time TR are integrated to be 0. Moreover, a phase-encoding magnetic field gradient sequentially changes in strength in relation to each view v. The phase of the RF pulse is changed sequentially in relation to each view v and the value of the repetition counter k.

Figure 4:
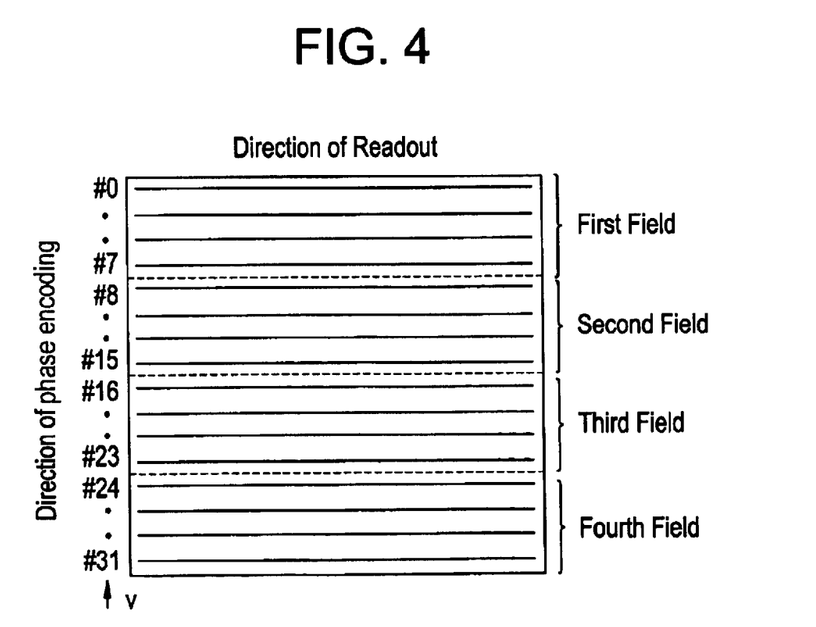
FIG. 4 is an explanatory diagram showing a k-space and views.

FIG. 4 is a conceptual diagram showing a k-space and a trajectory along which the k-space is scanned to acquire data.

The k-space is a two-dimensional space defined with the direction of readout and the direction of phase encoding.

Herein, assume that views v #0 to #31 are juxtaposed along the direction of the phase-encoding magnetic field gradient.

Assume that the k-space is divided into a first field composed of views #0 to #7, a second field composed of views #8 to #15, a third field composed of views #16 to #23, and a fourth field composed of views #24 to #31.

Figure 5:
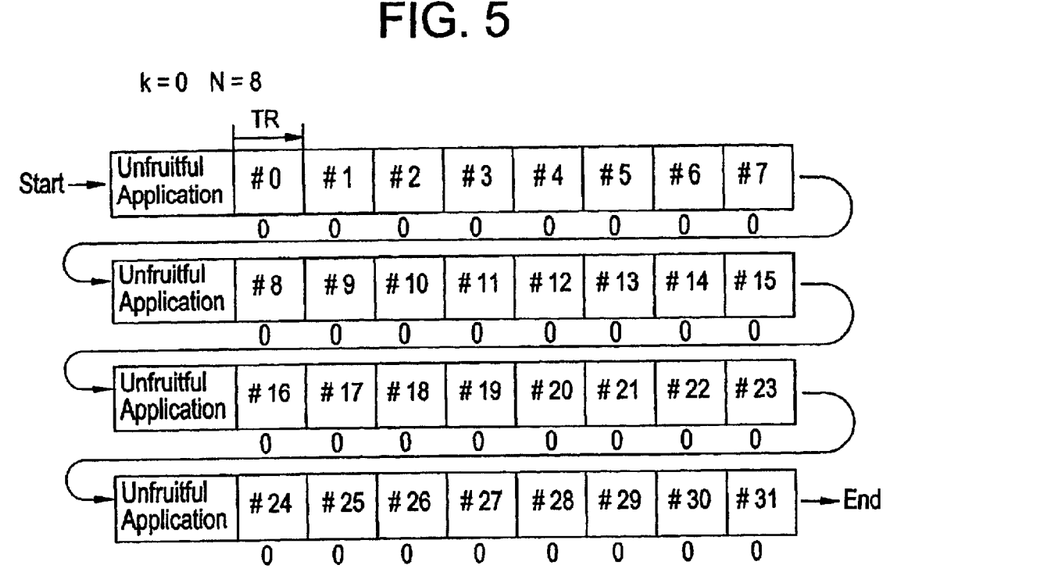
FIG. 5 shows an example of a data acquisition order and an example of the phase of an RF pulse.

FIG. 5 shows an example of a data acquisition order for $_{k=0}$ and an example of the phase of an RF pulse.

First of all, data is not acquired but the FIESTA pulse sequence is repeatedly applied in order to attain SSFP. This application shall be referred to as unfruitful application.

In SSFP, the FIESTA pulse sequence is applied in order to sequentially acquire data f0(0) to data f7(0) from views #0 to #7 constituting the first field. At this time, the phase of an RF pulse is set to 0 for all applications.

Thereafter, SSFP is attained through unfruitful application. Data f8(0) to data f15(0) are then sequentially acquired from views #8 to #15 constituting the second field. At this time, the phase of an RF pulse is set to 0 for all applications.

Thereafter, SSFP is attained through unfruitful application. Data f16(0) to data f23(0) are then sequentially acquired from views #16 to #23 constituting the third field. At this time, the phase of an RF pulse is set to 0 for all applications.

Thereafter, SSFP is attained through unfruitful application. Data f24(0) to data f31(0) are then sequentially acquired from views #24 to #31 constituting the fourth field. At this time, the phase of an RF pulse is set to 0 for all applications.

Figure 6:
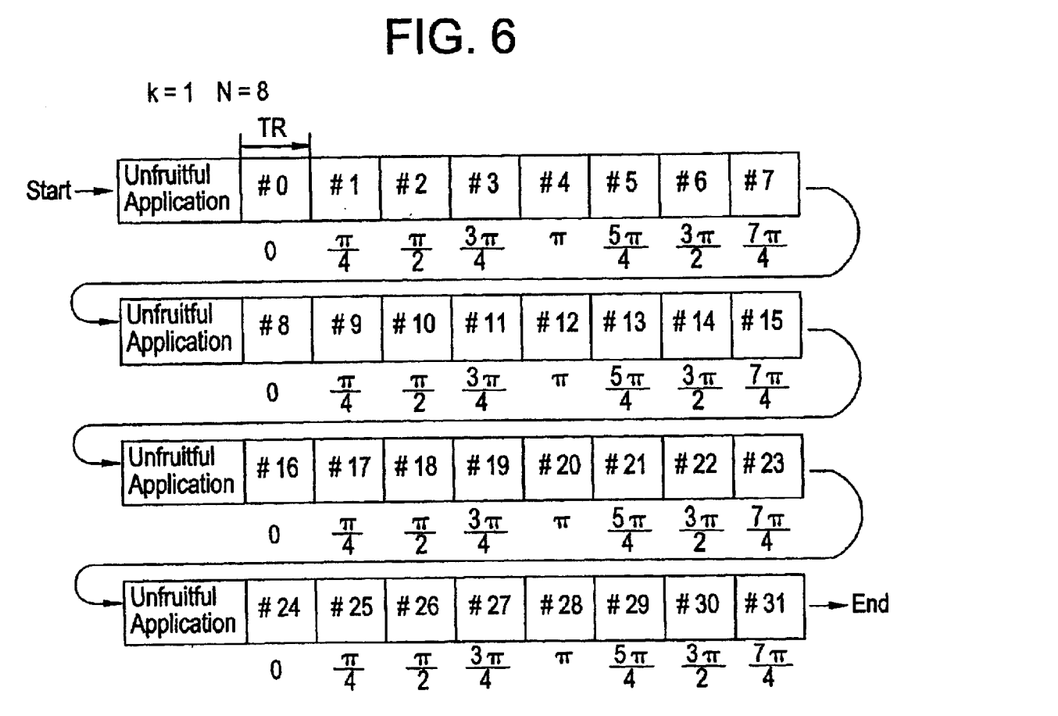
FIG. 6 shows another example of a data acquisition order and another example of the phase of an RF pulse.

FIG. 6 shows an example of a data acquisition order for k=1 and an example of the phase of an RF pulse.

First of all, SSFP is attained through unfruitful application. Data f0(1) to data f7(1) are then sequentially acquired from views #0 to #7 constituting the first field. At this time, the phase of an RF pulse is varied to be 0, π/4, π/2, 3π/4, π, 5π/4, 3π/2, and 7π/4 in that order.

Thereafter, SSFP is attained through unfruitful application. Data f8(1) to data f15(1) are then sequentially acquired from views #8 to #15 constituting the second field. At this time, the phase of an RF pulse is varied to be 0, π/4, π/2, 3π/4, π, 5π/4, 3π/2, and 7π/4 in that order.

Thereafter, SSFP is attained through unfruitful application. Data f16(1) to data f23(1) are then sequentially acquired from views #16 to #23 constituting the third field. At this time, the phase of an RF pulse is varied to be 0, π/4, π/2, 3π/4, π, 5π/4, 3π/2, and 7π/4 in that order.

Thereafter, SSFP is attained through unfruitful application. Data f24(1) to data f31(1) are then sequentially acquired from views #24 to #31 constituting the fourth field. At this time, the phase of an RF pulse is varied to be 0, π/4, π/2, 3π/4, π, 5π/4, 3π/2, and 7π/4 in that order.

Referring back to FIG. 2, at step S5, if an operator designates Fourier transform imaging, control is passed to step S6. Otherwise, control is passed to step S7.

At step S6, a Fourier transform is performed on data fv(k) relative to each of the phases indicated by the RF pulse in order to produce data Fv(n). The data Fv(n) is expressed as follows:

$$Fv(n) = {}_{k=0}\Sigma^7 fv(k) \cdot \exp\{-j \cdot n \cdot \pi \cdot k/4\}$$

Control is then passed to step S8.

At step S7, the data fv(k) is regarded as the data Fv(n) as it is. Control is then passed to step S8.

At step S8, if an operator selects root-mean-square conversion, control is passed to step S9. Otherwise, control is passed to step S10.

At step S9, root-mean-square conversion is performed on the data Fv(n) in order to produce data Av that is expressed as follows:

$$Av = \sqrt{\{(Fv(0))^2 + \ldots + Fv(7)2/8\}}$$

Control is then passed to step S11.

At step S10, weighted addition or maximum intensity projection (MIP) processing selected by an operator is performed on the data Fv(n) in order to produce data Av. Data Av resulting from weighted addition is expressed as follows:

$$Av = C0 \cdot Fv(0) + C1 \cdot Fv(1) + \ldots + C7 \cdot Fv(7)$$

where C0, C1, etc., and C7 denote weights.

Incidentally, when N=2, C0=C1=0.5 or C0=0.5 and C1=−0.5.

Data Av resulting from MIP processing is expressed as follows:

$$Av = \max\{Fv(0), \ldots, Fv(7)\}$$

where max{ } denotes a function for providing a maximum value.

Control is then passed to step S11.

At step S11, an image is reconstructed based on the data Av. Processing is then terminated.

According to the aforesaid MRI system 100, an operator can designate whether to a Fourier transform should be performed on data fv(k) relative to each of the phases indicated by an RF pulse. Moreover, the operator can select processing to be performed on data Fv(n) from among at least either of weighted addition and MIP processing and root-mean-square conversion. In cases where any conventional MR imaging method can produce only poor-quality images, good-quality images may be produced.

In the aforesaid embodiment, a k-space is divided into four fields. Alternatively, the k-space may not be divided or may be divided into five or more fields.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI system comprising:
  a transmitter coil that transmits a radio-frequency (RE) pulse;
  a gradient coil unit that applies magnetic field gradients;
  a receiver coil that receives an NMR signal;
  a scanning unit configured to:
    acquire information by driving said transmitter coil, gradient coil unit, and receiver coil;

repeat information acquisition in steady-state free precession (SSFP) N times by sequentially changing a phase for phase encoding until a first data set fv (k) ranging from data fv (0) to data fv (N−1) is acquired from views v; and simultaneously during the acquisition vary a phase of the RF pulse according to an expression 360°·v·/N, wherein N denotes a power of 2; and a data processing unit configured to:
perform arithmetic operations on the information;
generate a second data set Fv1(n) by performing a Fourier transform on the first data set fv(k) relative to each phase indicated by the RF pulse, wherein said Fourier transform is performed if an operator designates Fourier transform imaging,
use the first data set fv(k) as a third data set Fv2(n) if the operator does not designate Fourier transform imaging;
receive a selection from the operator whether a root-mean-square-conversion is to be performed on one of the second and third data sets;
perform the root-mean-square-conversion on one of the second and third data sets to produce a fourth data set if the operator selects the root-mean-square-conversion; and
perform one of weighted addition and maximum intensity projection on one of the second and third data sets to generate a fifth data set if the operator avoids selecting the root-mean-square conversion; and
reconstruct an image from one of the fourth and fifth data sets.

2. An MRI system according to claim 1, wherein a pulse sequence used to acquire the information in SSFP enables concurrent acquisition of a free induction decay (FID) signal and an echo, and magnetic field gradients adopted are such that each magnetic field gradient exhibits time-varying strength whose values detected during one repetition time TR are integrated to be 0.

3. An MRI system according to claim 1, wherein the second data set Fy1(n) resulting from the Fourier transform performed relative to each of the phases indicated by the RF pulse is expressed as follows:

$$Fv1(n) = \sum_{k=0}^{N-1} fv(k) \cdot \exp\{-j \cdot n \cdot 2\pi \cdot k / N\}.$$

4. An MRI system according to claim 1, wherein the fifth data set resulting from weighted addition for N=2 is equal to 0.5×Fv(0)+0.5×Fv(1).

5. An MRI system according to claim 1, wherein the fifth data set resulting from weighted addition for N=2 is equal to 0.5×Fv(0)−0.5×Fv(1).

6. An MRI system according to claim 1, wherein the fifth data set resulting from MIP processing that solves a function max { } for providing a maximum value is equal to max{Fv(0), . . . ,Fv(N−1)}.

7. An MRI system according to claim 1, wherein the fourth data set resulting from root-mean-square conversion is equal to $\sqrt{\{(Fv(0)^2+\ldots+Fv(N-1)^2)/N\}}$.

8. An MRI system comprising:
a transmitter coil that transmits an RF pulse;
a gradient coil unit that applies magnetic field gradients;
a receiver coil that receives an NMR signal;
a scanning unit configured to:
acquire information by driving said transmitter coil, gradient coil unit, and receiver coil;
repeat information acquisition in steady-state free precession (SSFP) N times by sequentially changing a phase for phase encoding until a first data set fv (k) ranging from data fv (0) to data fv (N−1) is acquired from views v; and
simultaneously during the acquisition vary a chase of the RF pulse according to an expression 360°·v·k/N, wherein N denotes a power of 2; and a data processing unit configured to:
perform arithmetic operations on the information;
generate a second data set Fv(n) by performing a Fourier transform on the first data set fv(k) relative to each phase indicated by the RF pulse;
receive a selection from an operator whether a root-mean-square-conversion is to be performed on the second data set;
perform the root-mean-square-conversion on the second data set to produce a third data set if the operator selects the root-mean-square-conversion;
perform one of weighted addition and maximum intensity projection on the second data set to generate a fourth data set if the operator avoids selecting the root-mean-square conversion; and
reconstruct an image from one of the third and fourth data sets.

9. An MRI system according to claim 8, wherein a pulse sequence used to acquire the information in SSFP enables concurrent acquisition of a free induction decay (FID) signal and an echo, and magnetic field gradients adopted are such that each magnetic field gradient exhibits time-varying strength whose values detected during one repetition time TR are integrated to be 0.

10. An MRI system according to claim 8, wherein the second data set Fv(n) resulting from the Fourier transform performed relative to each of the phases indicated by the RF pulse is expressed as follows:

$$Fv1(n) = \sum_{k=0}^{N-1} fv(k) \cdot \exp\{-j \cdot n \cdot 2\pi \cdot k / N\}.$$

11. An MRI system according to claim 8, wherein the fourth data set resulting from weighted addition for N=2 is equal to 0.5×Fv(0)+0.5×Fv(1).

12. An MRI system according to claim 8, wherein the fourth data set resulting from weighted addition for N=2 is equal to 0.5×Fv(0)−0.5×Fv(1).

13. An MRI system according to claim 8, wherein the fourth data set resulting from MIP processing that solves a function max { } for providing a maximum value is equal to max{Fv(0), . . . , Fv(N−1)}.

14. An MRI system according to claim 8, wherein the third data set resulting from root-mean-square conversion is equal to $\sqrt{\{(Fv(0)^2+\ldots+Fv(N-1)^2)/N\}}$.

15. An MRI system comprising:
a transmitter coil that transmits an RF pulse;
a gradient coil unit that applies magnetic field gradients;
a receiver coil that receives an NMR signal;
a scanning unit configured to:
acquire information by driving said transmitter coil, gradient coil unit, and receiver coil;
repeat information acquisition in steady-state free precession (SSFP) N times by sequentially changing a phase for phase encoding until a first data set fv (k) ranging from data fv (0) to data fv (N−1) is acquired from views v; and simultaneously during the acquisition vary a phase of the RF pulse according to an expression $360° \cdot v \cdot k/N$, wherein N denotes a power of 2; and a data processing unit configured to:
perform arithmetic operations on the information;
use the first data set fv(k) as a second data set Fv(n) if an operator does not designate Fourier transform imaging;
receive a selection from the operator whether a root-mean-square-conversion is to be performed on the second data set;
perform the root-mean-square-conversion on the second data set to produce a third data set if the operator selects the root-mean-square-conversion;
perform one of weighted addition and maximum intensity projection on the second data set to generate a fourth data set if the operator avoids selecting the root-mean-square conversion; and
reconstruct an image from one of the third and fourth data sets.

16. An MRI system according to claim 15, wherein a pulse sequence used to acquire the information in SSFP enables concurrent acquisition of a free induction decay (FID) signal and an echo, and magnetic field gradients adopted are such that each magnetic field gradient exhibits time-varying strength whose values detected during one repetition time TR are integrated to be 0.

17. An MRI system according to claim 15, wherein the fourth data set resulting from weighted addition for N=2 is equal to $0.5 \times Fv(0) + 0.5 \times Fv(1)$.

18. An MRI system according to claim 15, wherein the fourth data set resulting from weighted addition for N=2 is equal to $0.5 \times Fv(0) - 0.5 \times Fv(1)$.

19. An MRI system according to claim 15 wherein the fourth data set resulting from MIP processing that solves a function max { } for providing a maximum value is equal to $\max\{Fv(0), \ldots, Fv(N-1)\}$.

20. An MRI system according to claim 15, wherein the third data set resulting from root-mean-square conversion is equal to $\sqrt{\{Fv(0)^2 + \ldots + Fv(N-1)^2)/N\}}$.

\* \* \* \* \*

UNITED STATES PATENT AND TRADEMARK OFFICE
CERTIFICATE OF CORRECTION

PATENT NO. : 6,819,104 B2
APPLICATION NO. : 10/176225
DATED : November 16, 2004
INVENTOR(S) : Yamazaki et al.

It is certified that error appears in the above-identified patent and that said Letters Patent is hereby corrected as shown below:

In Claim 1, column 10, line 61, delete "radio-frequency (RE)" and insert therefor -- radio-frequency (RF) --.

In Claim 3, column 11, line 39, after "data set" delete "Fy1(n)" and insert therefore -- Fv1(n) --.

In Claim 8, column 12, line 6, after " vary a" delete " chase" and insert therefore -- phase --.

Signed and Sealed this

Fifteenth Day of August, 2006

JON W. DUDAS
*Director of the United States Patent and Trademark Office*